United States Patent
Eom et al.

(10) Patent No.: US 10,049,611 B2
(45) Date of Patent: Aug. 14, 2018

(54) DISPLAY APPARATUS

(71) Applicant: SAMSUNG DISPLAY CO., LTD., Yongin-si, Gyeonggi-Do (KR)

(72) Inventors: Ji Young Eom, Yongin-si (KR); Bo-Ram Kang, Gwangmyeong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 169 days.

(21) Appl. No.: 15/152,697

(22) Filed: May 12, 2016

(65) Prior Publication Data

US 2017/0148373 A1   May 25, 2017

(30) Foreign Application Priority Data

Nov. 19, 2015   (KR) .................. 10-2015-0162723

(51) Int. Cl.
| | |
|---|---|
| *G09G 3/20* | (2006.01) |
| *G02F 1/133* | (2006.01) |
| *G02F 1/1333* | (2006.01) |
| *G02F 1/1345* | (2006.01) |
| *H01L 23/00* | (2006.01) |
| *H01L 25/18* | (2006.01) |

(Continued)

(52) U.S. Cl.
CPC ....... *G09G 3/2092* (2013.01); *G02F 1/13306* (2013.01); *G02F 1/13452* (2013.01); *G02F 1/13458* (2013.01); *G02F 1/133305* (2013.01); *H01L 24/49* (2013.01); *H01L 25/18* (2013.01); *H01L 27/3248* (2013.01); *H01L 51/0097* (2013.01); *G09G 2380/02* (2013.01); *H01L 2224/48145* (2013.01); *H01L 2224/49171* (2013.01); *H01L 2251/5338* (2013.01); *H01L 2924/12044* (2013.01); *H01L 2924/1426* (2013.01)

(58) Field of Classification Search
CPC combination set(s) only.
See application file for complete search history.

(56) References Cited

U.S. PATENT DOCUMENTS

| | | | | |
|---|---|---|---|---|
| 2006/0163724 | A1* | 7/2006 | Hwang | ............... G02F 1/13452 257/737 |
| 2007/0007650 | A1* | 1/2007 | Tsukiji | ............... G02F 1/13452 257/737 |
| 2010/0127406 | A1* | 5/2010 | Higuchi | ............... H01L 23/522 257/776 |

FOREIGN PATENT DOCUMENTS

| | | |
|---|---|---|
| KR | 1020010082964 | 8/2001 |
| KR | 1020060020807 | 3/2006 |

* cited by examiner

*Primary Examiner* — Jennifer Mehmood
*Assistant Examiner* — Deeprose Subedi
(74) *Attorney, Agent, or Firm* — F. Chau & Associates, LLC

(57) ABSTRACT

A display apparatus includes a display panel and a display panel driver. The display panel driver includes a controller and a driver including a plurality of driving chips. Each of the driving chips includes a chip body, a plurality of input terminals, a plurality of first output terminals and a plurality of second output terminals. The chip body includes a bottom surface, a first side surface connected to the bottom surface and a second side surface opposite. The input terminals are disposed at a first region of the bottom surface adjacent to the first side surface of the chip body. The first output terminals are disposed at a second region of the bottom surface adjacent to the second side surface of the chip body. The second output terminals are disposed at a third region of the bottom surface adjacent to the first side surface of the chip body.

7 Claims, 7 Drawing Sheets

(51) Int. Cl.
*H01L 27/32* (2006.01)
*H01L 51/00* (2006.01)

DISPLAY APPARATUS

CROSS-REFERENCE TO RELATED APPLICATION

This application claims priority under 35 U.S.C. § 119 to Korean Patent Application No. 10-2015-0162723, filed on Nov. 19, 2015, in the Korean Intellectual Property Office (KIPO), the disclosure of which is incorporated by reference herein in its entirety.

TECHNICAL FIELD

Exemplary embodiments of the present invention relate to a display apparatus. More particularly, exemplary embodiments of the present invention relate to a display apparatus including a driver for applying a driving signal.

DISCUSSION OF THE RELATED ART

A display apparatus may include a display panel and a display panel driver. The display panel may include an active region that displays an image and a peripheral region adjacent to the active region. The display panel driver applies a driving signal to the display panel to drive the display panel. The display panel driver may include a gate driver and a data driver.

The data driver may include a plurality of data driving chips. Each of the data driving chips may include a plurality of input terminals and a plurality of output terminals. Each of the data driving chips may be mounted on a respective flexible substrate.

In a display panel having a high resolution, each of the data driving chips may include a large number of output terminals. The size of a data driving chip may be increased for the data driving chip to include a large number of terminals, However, an increase of the size of the data driving chip is limited by the size of the flexible substrate.

SUMMARY

According to an exemplary embodiment of the present invention, a display apparatus includes a display panel including a first substrate and a second substrate facing the first substrate, wherein the first substrate includes a switching element and a pixel electrode electrically connected to the switching element. A display panel driver includes a controller and a driver, wherein the controller is configured to generate a control signal, wherein the driver includes a plurality of driving chips, wherein each of the driving chips is configured to generate a driving signal based on the control signal, and wherein each of the driving chips is configured to apply the driving signal to the display panel. At least one of the driving chips includes a chip body including a bottom surface, a first side surface connected to the bottom surface and a second side surface opposite to the first side surface, a plurality of input terminals for receiving the control signal, wherein the input terminals are disposed at a first region of the bottom surface adjacent to the first side surface of the chip body, and the input terminals are arranged along a direction in which the first side surface of the chip body extends, a plurality of first output terminals for outputting the driving signal, wherein the first output terminals are disposed at a second region of the bottom surface adjacent to the second side surface of the chip body, and the first output terminals are arranged along a direction in which the second side surface of the chip body extends, and a plurality of second output terminals for outputting the driving signal, wherein the second output terminals are disposed at a third region of the bottom surface adjacent to the first side surface of the chip body and spaced apart from the second region of the bottom surface, and the second output terminals are arranged along the direction in which the first side surface of the chip body extends.

In an exemplary embodiment of the present invention, the third region of the bottom surface of the chip body includes first and second output regions spaced apart from each other. A first portion of the second output terminals are disposed at the first output region of the bottom surface of chip body, and a second portion of the second output terminals are disposed at the second output region of the bottom surface of chip body.

In an exemplary embodiment of the present invention, the at least one of the driving chips further includes a plurality of third output terminals disposed at a fourth region of the bottom surface adjacent to a third side surface of the chip body, wherein the third side surface is connected to the first and second side surfaces of the chip body, and the third output terminals are arranged along a direction in which the third side surface of the chip body extends, and a plurality of fourth output terminals disposed at a fifth region of the bottom surface of the chip body adjacent to a fourth side surface of the chip body, wherein the fourth side surface is opposite to the third side surface and is connected to the first and second side surfaces of the chip body, and the fourth output terminals are arranged along a direction in which the fourth side surface of the chip body extends.

In an exemplary embodiment of the present invention, the display panel driver further includes a plurality of input wires, wherein the input wires electrically connect the controller with a respective one of the input terminals of the driving chips, a plurality of first output wires, wherein the first output wires electrically connect a respective one of the first output terminals of the driving chips with the display panel, and a plurality of second output wires, wherein the second output wires electrically connect a respective one of the second output terminals of the driving chips with the display panel.

In an exemplary embodiment of the present invention, the display panel driver further includes a plurality of flexible substrates electrically connecting the controller with the display panel.

In an exemplary embodiment of the present invention, each of the driving chips is mounted on a respective one of the flexible substrates.

In an exemplary embodiment of the present invention, the display panel includes an active region for displaying an image and a peripheral region disposed adjacent to the active region, and each of the driving chips is mounted on the peripheral region of the display panel.

In an exemplary embodiment of the present invention, the driving signal includes a data voltage, and each of the driving chips includes a data driving chip configured to generate the data voltage.

In an exemplary embodiment of the present invention, the controller includes a printed circuit board.

In an exemplary embodiment of the present invention, the display panel further includes a liquid crystal layer or an organic light emitting layer interposed between the first and second substrates.

According to an exemplary embodiment of the present invention, a display apparatus includes a display panel including a first substrate and a second substrate facing the first substrate, wherein the first substrate includes a switching element and a pixel electrode electrically connected to the switching element. A display panel driver includes a controller configured to generate a control signal and a driver including a plurality of driving chips, wherein each of the driving chips is configured to generate a driving signal based on the control signal, and wherein each of the driving chips is configured to apply the driving signal to the display panel. A first driving chip of the driving chips includes a chip body including a bottom surface, a first side surface connected to the bottom surface, a second side surface opposite to the first side surface, a third side surface connecting the first and second side surfaces and a fourth side surface connecting the first and second side surfaces, wherein the fourth side surface is opposite to the third side surface, a plurality of input terminals for receiving the control signal, wherein the input terminals are disposed at a first region of the bottom surface adjacent to the first side surface of the chip body, and the input terminals are arranged along a direction in which the first side surface of the chip body extends, a plurality of first output terminals for outputting the driving signal, wherein the plurality of first output terminals are disposed at a second region of the bottom surface adjacent to the second side surface of the chip body, and the first output terminals are arranged along a direction in which the second side surface of the chip body extends, a plurality of second output terminals for outputting the driving signal, wherein the plurality of second output terminals are disposed at a third region of the bottom surface adjacent to the third side surface of the chip body, and the second output terminals are arranged along a direction in which the third side surface of the chip body extends, and a plurality of third output terminals for outputting the driving signal, wherein the plurality of third output terminals are disposed at a fourth region of the bottom surface adjacent to the fourth side surface of the chip body, and the third output terminals are arranged along a direction in which the fourth side surface of the chip body extends.

In an exemplary embodiment of the present invention, the first driving chip further includes a plurality of fourth terminals disposed at a fifth region of the bottom surface, wherein the fifth region is disposed adjacent to the first side surface of the chip body. The fifth region of the bottom surface of the chip body is spaced apart from the second region of the bottom surface of the chip body. The fourth terminals are arranged along a direction in which the first side surface of the chip body extends.

In an exemplary embodiment of the present invention, the fifth region of the bottom surface of the chip body includes first and second output regions spaced apart from each other. A first portion of the fourth output terminals are disposed at the first output region of the bottom surface of chip body, and a second portion of the fourth output terminals are disposed at the second output region of the bottom surface of chip body.

In an exemplary embodiment of the present invention, the display panel driver further includes a plurality of input wires, wherein the input wires electrically connect the controller with a respective one of the input terminals of a respective one of the driving chips, a plurality of first output wires, wherein the first output wires electrically connect a respective one of the first output terminals of the driving chips with the display panel, a plurality of second output wires, wherein the second output wires electrically connect a respective one of the second output terminals of the driving chips with the display panel, and a plurality of third output wires, wherein the third output wires electrically connect a respective one of the third output terminals of the driving chips with the display panel.

In an exemplary embodiment of the present invention, the display panel driver further includes a plurality of flexible substrates electrically connecting the controller with the display panel.

In an exemplary embodiment of the present invention, each of the driving chips is mounted on a respective one of the flexible substrates.

In an exemplary embodiment of the present invention, the display panel includes an active region displaying an image and a peripheral region disposed adjacent to the active region. Each of the driving chips is mounted on the peripheral region of the display panel.

In an exemplary embodiment of the present invention, the driving signal includes a data voltage. Each of the driving chips includes a data driving chip configured to generate the data voltage.

In an exemplary embodiment of the present invention, the controller includes a printed circuit board.

In an exemplary embodiment of the present invention, the display panel further includes a liquid crystal layer or an organic light emitting layer interposed between the first and second substrates.

According to an exemplary embodiment of the present invention, a driving chip for a display apparatus includes a chip body configured to receive a control signal and to generate a driving signal to drive a display panel based on the control signal. The chip body includes a first surface, wherein the first surface has a first edge, a second edge, a third edge and a fourth edge, wherein the first and second edges are opposite to each other and the third and fourth edges are opposite to each other, a plurality of input terminals disposed at a first region of the first surface and aligned along the first edge, wherein the input terminals are configured to receive the control signal, a plurality of first output terminals disposed at a second region of the first surface and aligned along the second edge, wherein the first output terminals are configured to output the driving signal, and a plurality of second output terminals disposed at a third region of the first surface and aligned along the first edge, wherein the second output terminals are configured to output the driving signal.

BRIEF DESCRIPTION OF THE DRAWINGS

Exemplary embodiments of the present invention will become more clearly understood from the following detailed description taken in conjunction with the accompanying drawings, in which.

DETAILED DESCRIPTION OF THE EMBODIMENTS

Figure 1:
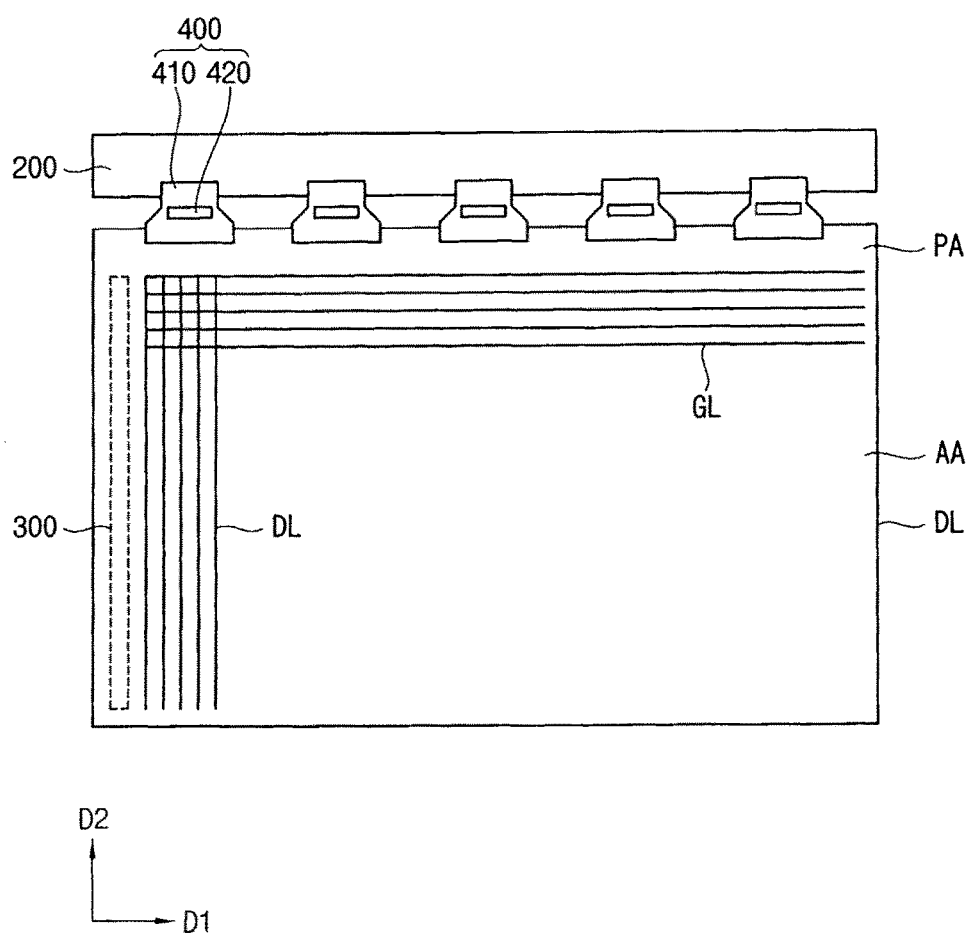
FIG. 1 is a plan view illustrating a display apparatus according to an exemplary embodiment of the present invention.

Various exemplary embodiments of the present invention will be described more fully hereinafter with reference to the accompanying drawings. The present invention may, however, be embodied in many different forms and should not be construed as limited to the exemplary embodiments thereof set forth herein. Like reference numerals may refer to like elements throughout this application.

Figure 2:
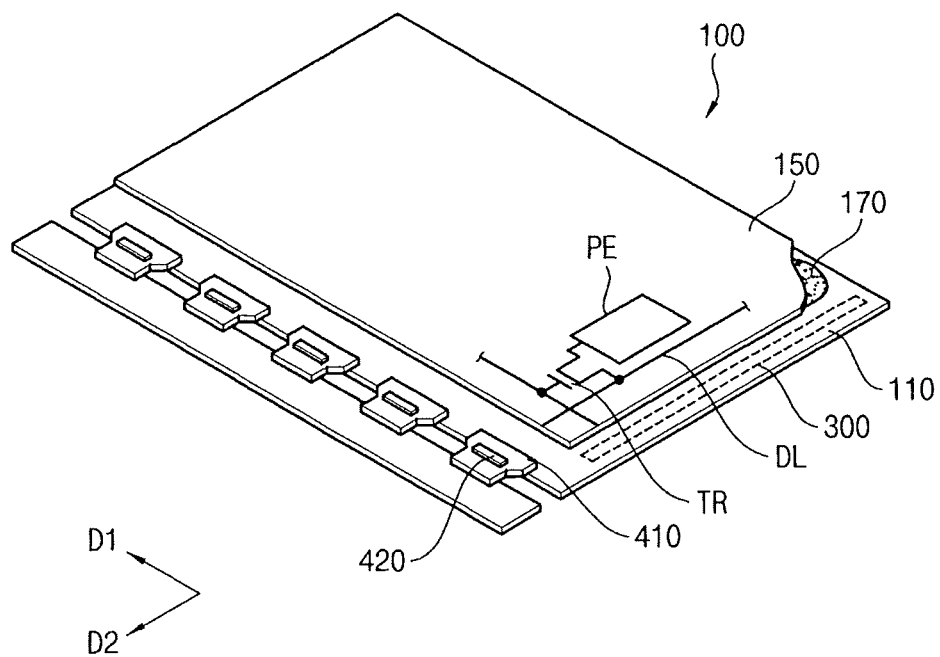
FIG. 2 is a perspective view illustrating the display apparatus of FIG. 1, according to an exemplary embodiment of the present invention.
Figure 3:
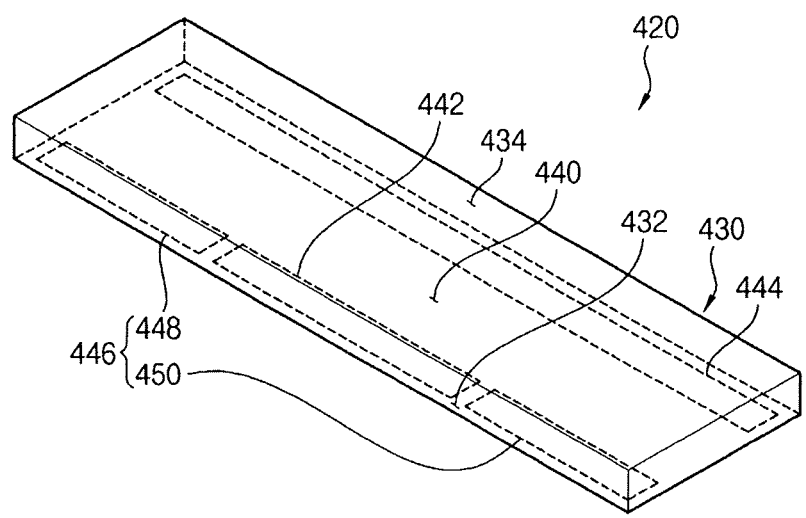
FIG. 3 is a perspective view illustrating a data driving chip of FIG. 1, according to an exemplary embodiment of the present invention.
Figure 4:
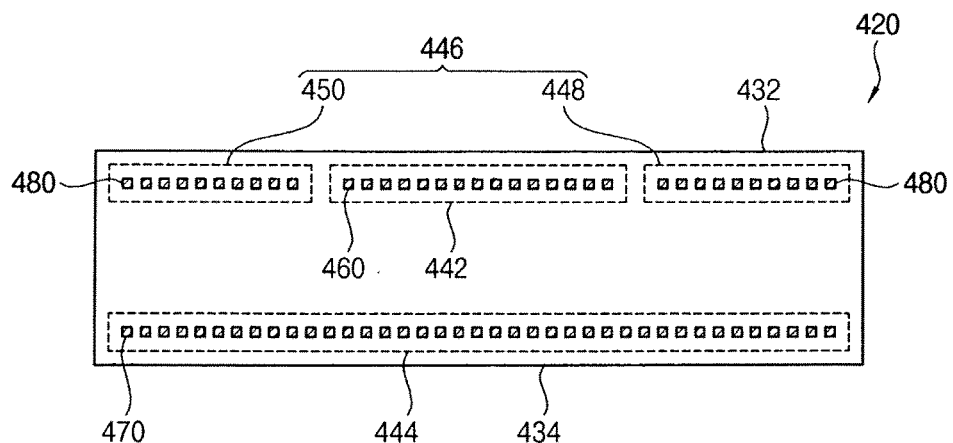
FIG. 4 is a plan view illustrating a data driving chip of FIG. 1, according to an exemplary embodiment of the present invention.
Figure 5:
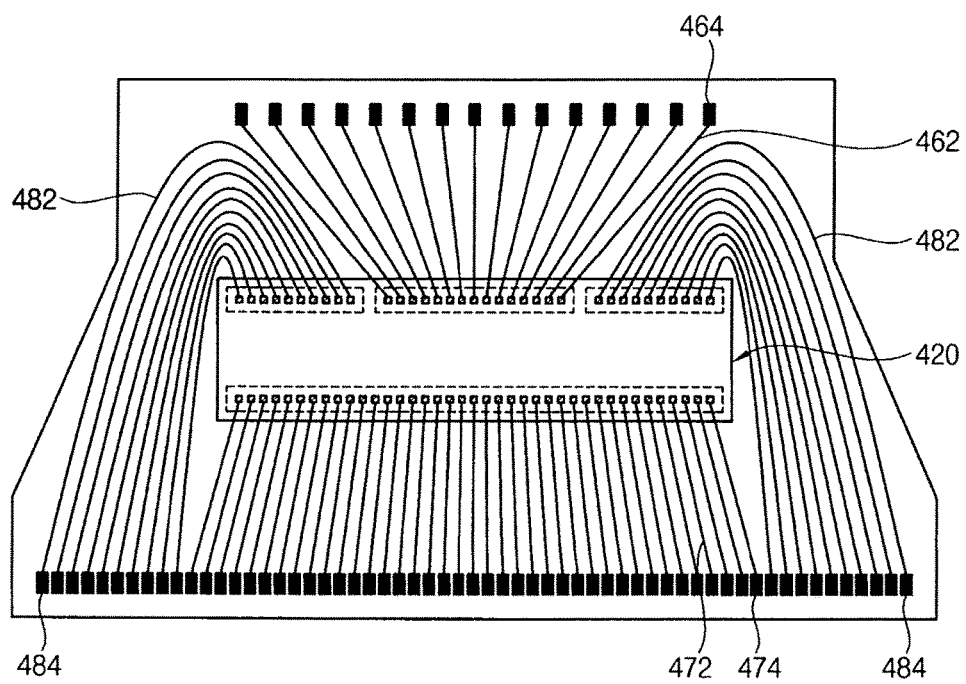
FIG. 5 is a plan view illustrating a data driver of FIG. 1, according to an exemplary embodiment of the present invention.

FIG. 1 is a plan view illustrating a display apparatus according to an exemplary embodiment of the present invention. FIG. 2 is a perspective view illustrating the display apparatus of FIG. 1, according to an exemplary embodiment of the present invention. FIG. 3 is a perspective view illustrating a data driving chip of FIG. 1, according to an exemplary embodiment of the present invention. FIG. 4 is a plan view illustrating a data driving chip of FIG. 1, according to an exemplary embodiment of the present invention. FIG. 5 is a plan view illustrating a data driver of FIG. 1, according to an exemplary embodiment of the present invention.

Referring to FIGS. 1 to 5, a display apparatus includes a display panel 100 and a display panel driver.

The display panel 100 includes an active region AA on which an image is displayed and a peripheral region PA adjacent to the active region AA. An image is not displayed on the peripheral region PA. The active region AA may be referred to as a display region.

The display panel 100 includes a plurality of gate lines GL, each of which extends in a first direction D1, and a plurality of data lines DL, each of which extends in a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR and a pixel electrode PE electrically connected to the switching element TR. The pixels may be disposed in a matrix form.

The display panel 100 may include a first substrate 110 and a second substrate 150 opposite to the first substrate 110.

For example, the first substrate 110 may be an array substrate. The gate lines GL and the data lines DL may be disposed on the first substrate 110. A plurality of switching elements TR connected to the gate lines GL and the data lines DL may be disposed on the first substrate 110. The pixel electrode PE may be disposed on the first substrate 110.

The second substrate 150 may be a corresponding substrate opposite to the first substrate 110. A common electrode facing the pixel electrode PE may be disposed under the second substrate 150. A color filter defining a color of a pixel may be disposed under the second substrate 150. Alternatively, the common electrode and the color filter may be disposed on the first substrate 110.

An overlap area between the first substrate 110 and the second substrate 150 may be substantially the same as the active region AA of the display panel 100. Alternatively, the overlap area between the first substrate 110 and the second substrate 150, except for an area where a sealing member is disposed, may be referred to as the active region AA of the display panel 100.

The display apparatus may further include a display unit 170 interposed between the first and second substrates 110 and 150. The display unit 170 may include an organic light emitting layer. Alternatively, the display unit 170 may include a liquid crystal layer.

The display panel driver may apply a driving signal to the display panel 100. The display panel driver may include a gate driver 300 and a data driver 400.

In an exemplary embodiment of the present invention, the display panel driver may further include a controller for applying a control signal to the gate driver 300 and the data driver 400. The controller may include a printed circuit board 200.

For example, the printed circuit board 200 may include a driving circuit such as a timing controller, a power voltage generator, etc.

The timing controller receives input image data and an input control signal from an external apparatus. The input image data may include red image data, green image data and blue image data. The input control signal may include a master clock signal and a data enable signal. The input control signal may further include a vertical synchronizing signal and a horizontal synchronizing signal.

The timing controller generates a first control signal, a second control signal and a data signal based on the input image data and the input control signal.

The timing controller generates the first control signal for controlling an operation of the gate driver 300 based on the input control signal, and outputs the first control signal to the gate driver 300.

The timing controller generates the second control signal for controlling an operation of the data driver 400 based on the input control signal, and outputs the second control signal to the data driver 400.

The timing controller generates a data signal based on the input image data. The timing controller outputs the data signal to the data driver 400.

The gate driver 300 generates gate signals driving the gate lines GL in response to the first control signal received from the timing controller. The gate driver 300 sequentially outputs the gate signals to the gate lines GL.

The gate driver 300 may be directly mounted on the peripheral region PA as an amorphous silicon gate (ASG). Alternatively, the gate driver 300 may include a plurality of flexible substrates connected to the peripheral region PA of the display panel 100 and a plurality of gate driving chips. Each of the gate driving chips may be mounted on a respective flexible substrate.

The data driver 400 receives the second control signal and the data signal from the timing controller. The data driver 400 converts the data signal into analog data voltages. The data driver 400 outputs the data voltages to the data lines DL.

For example, the control signal may include the first and second control signals and the data signal. The driving signal may include the gate signal and the data voltage.

The data driver 400 may include and a plurality of data driving chips 420 and a plurality of data flexible substrates 410 electrically connecting the printed circuit board 200 with the display panel 100.

For example, each of the data driving chips 420 may be mounted on a respective one of the data flexible substrates 410.

Each of the data driving chips 420 may include a chip body 430, a plurality of input terminals 460, a plurality of first output terminals 470 and a plurality of second output terminals 480.

The input terminals 460 may be disposed at a first region 442 of a bottom surface 440, adjacent to a first side surface 432 of the chip body 430. The input terminals 460 may be arranged along the first side surface 432 of the chip body 430. For example, the input terminals 460 may be arranged along the extension direction of the first side surface 432 of the chip body 430.

The first output terminals 470 may be disposed at a second region 444 of the bottom surface 440, adjacent to a second side surface 434 opposite to the first side surface 432 of the chip body 430. The first output terminals 470 may be arranged along the second side surface 434 of the chip body 430. For example, the first output terminals 470 may be arranged along the extension direction of the second side surface 434 of the chip body 430.

The second output terminals 480 may be disposed at a third region 446 of the bottom surface 440, adjacent to the first side surface 432 of the chip body 430. The third region 446 of the bottom surface 440 may be spaced apart from the second region 444 of the bottom surface 440 of the chip body 430. The second output terminals 480 may be arranged along the first side surface 432 of the chip body 430. For example, the second output terminals 480 may be arranged along the extension direction of the first side surface 432 of the chip body 430.

In an exemplary embodiment of the present invention, the third region 446 of the bottom surface 440 of the chip body 430 may include first and second output regions 448 and 450 spaced apart from each other. For example, the first region 442 of the bottom surface 440 of the chip body 430 may be disposed between the first and second output regions 448 and 450. A portion of the second output terminals 480 may be arranged at the first output region 448. Another portion of the second output terminals 480 may be arranged at the second output region 450.

In an exemplary embodiment of the present invention, the display panel driver may further include a plurality of input wires 462, a plurality of first output wires 472 and a plurality of second output wires 482.

Each of the input wires 462 may electrically connect the controller with a respective one of the input terminals 460 of the data driving chip 420. Each of the first output wires 472 may electrically connect a respective one of the first output terminals 470 of the data driving chip 420 with the display panel 100. Each of the second output wires 482 may electrically connect a respective one of the second output terminals 480 of the data driving chip 420 with the display panel 100.

For example, a first end of each of the input wires 462 may be electrically connected to a respective one of the input terminals 460. A second end of each of the input wires 462 may be electrically connected to a respective one of a plurality of input pads 464. The input pads 464 may be arranged on the data flexible substrate 410 to make contact with the printed circuit board 200.

In addition, a first end of each of the first output wires 472 may be electrically connected to a respective one of the first output terminals 470. A second end of each of the first output wires 472 may be electrically connected to a respective one of a plurality of first output pads 474. The first output pads 474 may be arranged on the data flexible substrate 410 to make contact with the display panel 100.

A first end of each of the second output wires 482 may be electrically connected to a respective one of the second output terminals 480. A second end of each of the second output wires 482 may be electrically connected to a respective one of a plurality of second output pads 484. The second output pads 484 may be arranged on the data flexible substrate 410 to make contact with the display panel 100.

In a display apparatus, according to an exemplary embodiment of the present invention, additional second output terminals 480 may be disposed at the bottom surface 440 of the chip body 430. For example, a high resolution image may be displayed at the display apparatus without increasing a bezel size or a driving chip size of the display apparatus.

In the display apparatus displaying the high resolution image, a space of the driving chip is utilized to provide the additional output terminals 480 such that a compact display apparatus is implemented.

Figure 6:
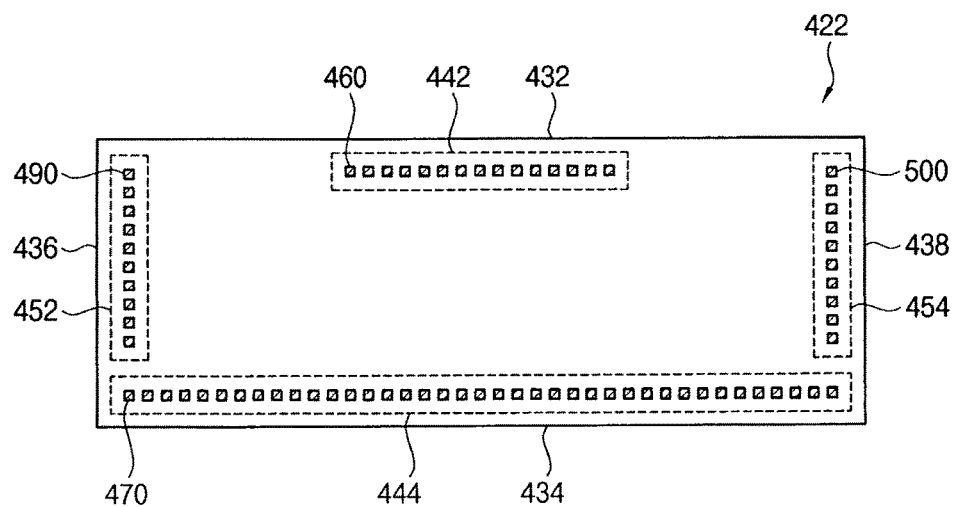
FIG. 6 is a plan view illustrating a data driving chip according to an exemplary embodiment of the present invention.
Figure 7:
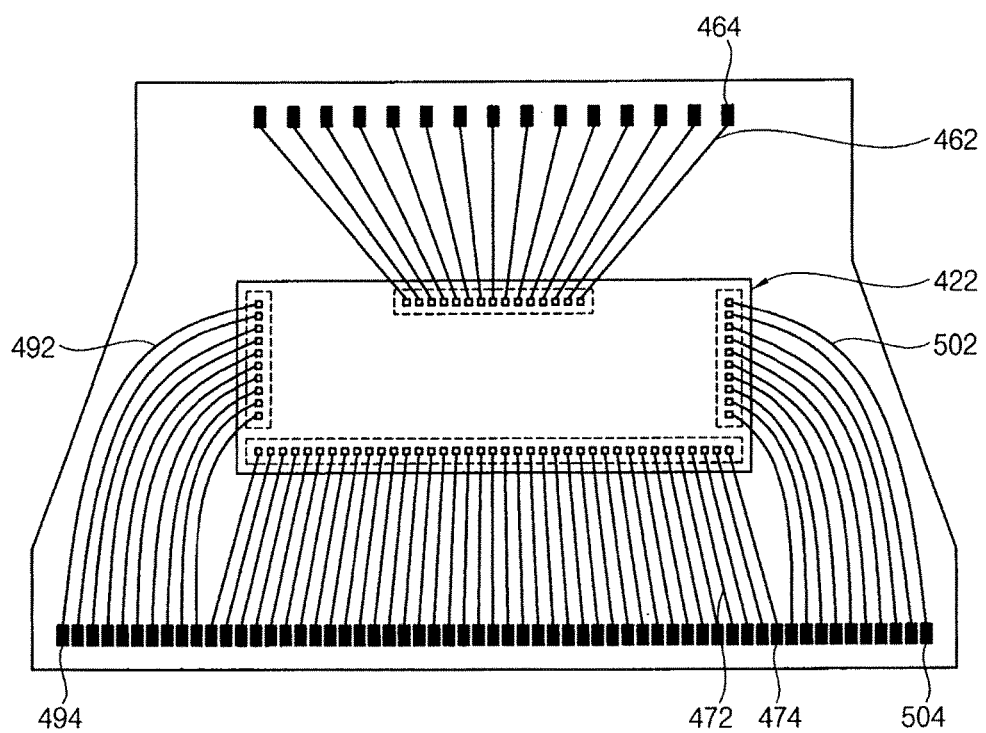
FIG. 7 is a plan view illustrating a data driver including the data driving chip of FIG. 6, according to an exemplary embodiment of the present invention.

FIG. 6 is a plan view illustrating a data driving chip according to an exemplary embodiment of the present invention. FIG. 7 is a plan view illustrating a data driver including the data driving chip of FIG. 6, according to an exemplary embodiment of the present invention. The data driving chip of FIGS. 6 and 7 may be substantially the same as that of FIGS. 1 to 5, except for having a plurality of third output terminals and a plurality of fourth output terminals instead of the second output terminals. Thus, like reference numerals may refer to like elements, and repetitive explanations thereof may be omitted.

Referring to FIGS. 1, 2, 6 and 7, the display apparatus may include a display panel 100 and a display panel driver.

The display panel 100 includes an active region AA on which an image is displayed and a peripheral region PA adjacent to the active region AA. An image is not displayed on the peripheral region PA. The active region AA may be referred to as a display region.

The display panel 100 may include a first substrate 110 and a second substrate 150 opposite to the first substrate 110.

The display panel driver may apply a driving signal to the display panel 100. The display panel driver may include a gate driver 300 and a data driver 400.

In an exemplary embodiment of the present invention, the display panel driver may further include a controller for applying a control signal to the gate driver 300 and the data driver 400. The controller may include a printed circuit board 200.

For example, the printed circuit board 200 may include a driving circuit such as a timing controller, a power voltage generator, etc.

The gate driver 300 may be directly mounted on the peripheral region PA as an ASG. Alternatively, the gate driver 300 may include a plurality of flexible substrates connected to the peripheral region PA of the display panel 100 and a plurality of gate driving chips. Each of the gate driving chips may be mounted on a respective one of the flexible substrates.

The data driver 400 may include and a plurality of data driving chips 422 and a plurality of data flexible substrates 410 connecting electrically the printed circuit board 200 with the display panel 100.

For example, each of the data driving chips 422 may be mounted on a respective one of the data flexible substrates 410.

Each of the data driving chips 422 may include a chip body 430, a plurality of input terminals 460, a plurality of first output terminals 470, a plurality of third output terminals 490 and a plurality of fourth output terminals 500.

The input terminals 460 may be disposed at a first region 442 of a bottom surface 440, adjacent to a first side surface 432 of the chip body 430. The input terminals 460 may be arranged along the first side surface 432 of the chip body 430. For example, the input terminals 460 may be arranged along the extension direction of the first side surface 432 of the chip body 430.

The first output terminals 470 may be disposed at a second region 444 of the bottom surface 440, adjacent to a second side surface 434 opposite to the first side surface 432 of the chip body 430. The first output terminals 470 may be arranged along the second side surface 434 of the chip body 430. For example, the first output terminals 470 may be arranged along the extension direction of the second side surface 434 of the chip body 430.

The third output terminals 490 may be disposed at a fourth region 452 of the bottom surface 440, adjacent to a third side surface 436 connecting the first and second side surfaces 432 and 434 of the chip body 430. The third output terminals 490 may be arranged along the third side surface 436 of the chip body 430. For example, the third output terminals 490 may be arranged along the extension direction of the third side surface 436 of the chip body 430.

The fourth output terminals 500 may be disposed at a fifth region 454 of the bottom surface 440 of the chip body 430, adjacent to a fourth side surface 438 connecting the first and second side surfaces 432 and 434 of the chip body 430. The fourth side surface 438 of the chip body 430 may be opposite to the third side surface 436. The fourth output terminals 500 may be arranged along the fourth side surface 438 of the chip body 430. For example, the fourth output terminals 500 may be arranged along the extension direction of the fourth side surface 438 of the chip body 430.

In an exemplary embodiment of the present invention, the display panel driver may further include a plurality of input wires 462, a plurality of first output wires 472, a plurality of third output wires 492 and a plurality of fourth output wires 502.

Each of the input wires 462 may electrically connect the controller with a respective one of the input terminals 460 of the data driving chip 422. Each of the first output wires 472 may electrically connect a respective one of the first output terminals 470 of the data driving chip 422 with the display panel 100. Each of the third output wires 492 may electrically connect a respective one of the third output terminals 490 of the data driving chip 422 with the display panel 100. Each of the fourth output wires 502 may electrically connect a respective one of the fourth output terminals 500 of the data driving chip 422 with the display panel 100.

For example, a first end of each of the input wires 462 may be electrically connected to a respective one of the input terminals 460. A second end of each of the input wires 462 may be electrically connected to a respective one of a plurality of input pads 464. The input pads 464 may be arranged on the data flexible substrate 410 to make contact with the printed circuit board 200.

In addition, a first end of each of the first output wires 472 may be electrically connected to a respective one of the first output terminals 470. A second end of each of the first output wires 472 may be electrically connected to a respective one of a plurality of first output pads 474. The first output pads 474 may be arranged on the data flexible substrate 410 to make contact with the display panel 100.

A first end of each of the third output wires 492 may be electrically connected to a respective one of the third output terminals 490. A second end of each of the third output wires 492 may be electrically connected to a respective one of a plurality of third output pads 494. The third output pads 494 may be arranged on the data flexible substrate 410 to make contact with the display panel 100.

A first end of each of the fourth output wires 502 may be electrically connected to a respective one of the fourth output terminals 500. A second end of each of the fourth output wires 502 may be electrically connected to a respective one of a plurality of fourth output pads 504. The fourth output pads 504 may be arranged on the data flexible substrate 410 to make contact with the display panel 100.

In a display apparatus, according to an exemplary embodiment of the present invention, additional third and fourth output terminals 490 and 500 may be disposed at the bottom surface 440 of the chip body 430. For example, a high resolution image may be displayed at the display apparatus without increasing a bezel size or a driving chip size of the display apparatus.

In the display apparatus displaying the high resolution image, a space of the driving chip is utilized to provide the additional output terminals 490 and 500 such that a compact display apparatus is implemented.

Figure 8:
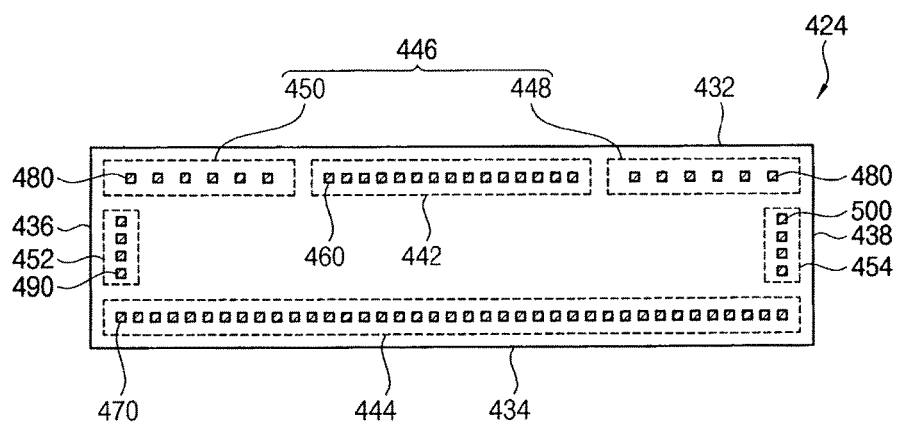
FIG. 8 is a plan view illustrating a data driving chip according to an exemplary embodiment of the present invention.
Figure 9:
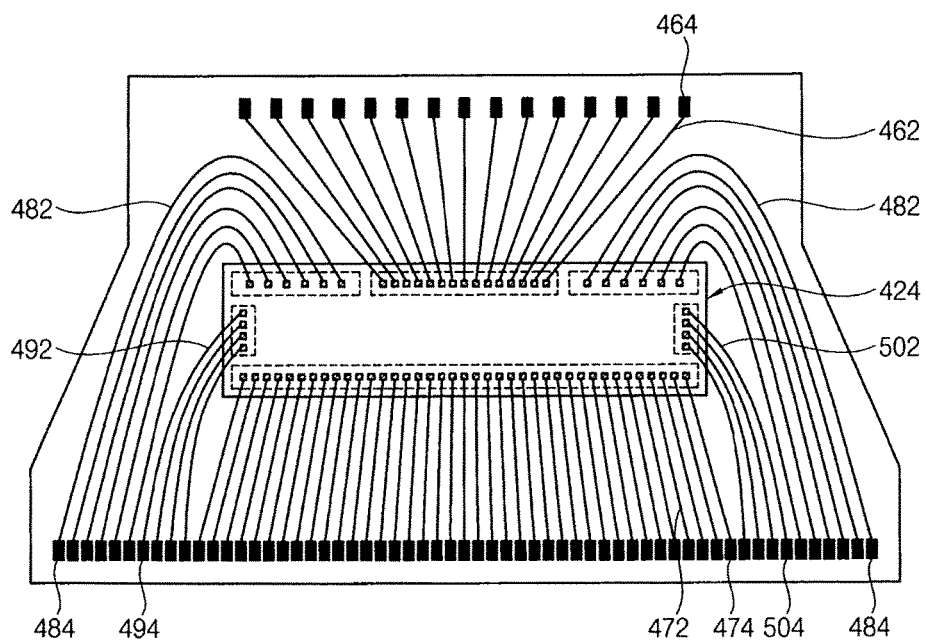
FIG. 9 is a plan view illustrating a data driver including the data driving chip of FIG. 8, according to an exemplary embodiment of the present invention.

FIG. 8 is a plan view illustrating a data driving chip according to an exemplary embodiment of the present invention. FIG. 9 is a plan view illustrating a data driver including the data driving chip of FIG. 8, according to an exemplary embodiment of the present invention. A data driving chip of FIGS. 8 and 9 may be substantially the same as that of FIGS. 1 to 5, except for a plurality of third output terminals and a plurality of fourth output terminals. Thus, like reference numerals may refer to like elements, and repetitive explanations thereof may be omitted.

Referring to FIGS. 1, 2, 8 and 9, the display apparatus may include a display panel 100 and a display panel driver.

The display panel 100 includes an active region AA on which an image is displayed and a peripheral region PA adjacent to the active region AA. An image is not displayed on the peripheral region PA. The active region AA may be referred to as a display region.

The display panel 100 may include a first substrate 110 and a second substrate 150 opposite to the first substrate 110.

The display panel driver may apply a driving signal to the display panel 100. The display panel driver may include a gate driver 300 and a data driver 400.

In an exemplary embodiment of the present invention, the display panel driver may further include a controller applying a control signal to the gate driver 300 and the data driver 400. The controller may include a printed circuit board 200.

For example, the printed circuit board 200 may include a driving circuit such as a timing controller, a power voltage generator, etc.

The gate driver 300 may be directly mounted on the peripheral region PA as an ASG Alternatively, the gate driver 300 may include a plurality of flexible substrates connected to the peripheral region PA of the display panel 100 and a plurality of gate driving chips. Each of the gate driving chips may be mounted on a respective flexible substrate.

The data driver 400 may include and a plurality of data driving chips 424 and a plurality of data flexible substrates 410 electrically connecting the printed circuit board 200 with the display panel 100.

For example, each of the data driving chips 424 may be mounted on a respective one of the data flexible substrates 410.

Each of the data driving chips 424 may include a chip body 430, a plurality of input terminals 460, a plurality of first output terminals 470, a plurality of second output terminals 480, a plurality of third output terminals 490 and a plurality of fourth output terminals 500.

The input terminals 460 may be disposed at a first region 442 of a bottom surface 440, adjacent to a first side surface 432 of the chip body 430. The input terminals 460 may be arranged along the first side surface 432 of the chip body 430. For example, the input terminals 460 may be arranged along the extension direction of the first side surface 432 of the chip body 430.

The first output terminals 470 may be disposed at a second region 444 of the bottom surface 440, adjacent to a second side surface 434 opposite to the first side surface 432 of the chip body 430. The first output terminals 470 may be arranged along the second side surface 434 of the chip body 430. For example, the first output terminals 470 may be arranged along the extension direction of the second side surface 434 of the chip body 430.

The second output terminals 480 may be disposed at a third region 446 of the bottom surface 440, adjacent to the first side surface 432 of the chip body 430. The third region 446 of the bottom surface 440 may be spaced apart from the second region 444 of the bottom surface 440 of the chip body 430. The second output terminals 480 may be arranged along the first side surface 432 of the chip body 430. For example, the second output terminals 480 may be arranged along the extension direction of the first side surface 432 of the chip body 430.

The third output terminals 490 may be disposed at a fourth region 452 of the bottom surface 440, adjacent to a third side surface 436 connecting the first and second side surfaces 432 and 434 of the chip body 430. The third output terminals 490 may be arranged along the third side surface 436 of the chip body 430. For example, the third output terminals 490 may be arranged along the extension direction of the third side surface 436 of the chip body 430.

The fourth output terminals 500 may be disposed at a fifth region 454 of the bottom surface 440 of the chip body 430, adjacent to a fourth side surface 438 connecting the first and second side surfaces 432 and 434 of the chip body 430. The fourth side surface 438 of the chip body 430 may be opposite to the third side surface 436. The fourth output terminals 500 may be arranged along the fourth side surface 438 of the chip body 430. For example, the fourth output terminals 500 may be arranged along the extension direction of the fourth side surface 438 of the chip body 430.

In an exemplary embodiment of the present invention, the third region 446 of the bottom surface 440 of the chip body 430 may include first and second output regions 448 and 450 spaced apart from each other. For example, the first region 442 of the bottom surface 440 of the chip body 430 may be disposed between the first and second output regions 448 and 450. A portion of the second output terminals 480 may be arranged at the first output region 448. Another portion of the second output terminals 480 may be arranged at the second output region 450.

In an exemplary embodiment of the present invention, the display panel driver may further include a plurality of input wires 462, a plurality of first output wires 472, a plurality of second output wires 482, a plurality of third output wires 492 and a plurality of fourth output wires 502.

Each of the input wires 462 may electrically connect the controller with a respective one of the input terminals 460 of the data driving chip 424. Each of the first output wires 472 may electrically connect a respective one of the first output terminals 470 of the data driving chip 424 with the display panel 100. Each of the second output wires 482 may electrically connect a respective one of the second output terminals 480 of the data driving chip 424 with the display panel 100. Each of the third output wires 492 may electrically connect a respective one of the third output terminals 490 of the data driving chip 424 with the display panel 100. Each of the fourth output wires 502 may electrically connect a respective one of the fourth output terminals 500 of the data driving chip 424 with the display panel 100.

For example, a first end of each of the input wires 462 may be electrically connected to a respective one of the input terminals 460. A second end of each of the input wires 462 may be electrically connected to a respective one of a plurality of input pads 464. The input pads 464 may be arranged on the data flexible substrate 410 to make contact with the printed circuit board 200.

In addition, a first end of each of the first output wires 472 may be electrically connected to a respective one of the first output terminals 470. A second end of each of the first output wires 472 may be electrically connected to a respective one of a plurality of first output pads 474. The first output pads 474 may be arranged on the data flexible substrate 410 to make contact with the display panel 100.

A first end of each of the second output wires 482 may be electrically connected to a respective one of the second output terminals 480. A second end of each of the second output wires 482 may be electrically connected to a respective one of a plurality of second output pads 484. The second output pads 484 may be arranged on the data flexible substrate 410 to make contact with the display panel 100.

A first end of each of the third output wires 492 may be electrically connected to a respective one of the third output terminals 490. A second end of each of the third output wires 492 may be electrically connected to a respective one of a plurality of third output pads 494. The third output pads 494 may be arranged on the data flexible substrate 410 to make contact with the display panel 100.

A first end of each of the fourth output wires 502 may be electrically connected to a respective one of the fourth output terminals 500. A second end of each of the fourth output wires 502 may be electrically connected to a respective one of a plurality of fourth output pads 504. The fourth output pads 504 may be arranged on the data flexible substrate 410 to make contact with the display panel 100.

In a display apparatus, according to an exemplary embodiment of the present invention, additional second, third and fourth output terminals 480, 490 and 500 may be disposed at the bottom surface 440 of the chip body 430. For example, a high resolution image may be displayed at the display apparatus without increasing a bezel size or a driving chip size of the display apparatus.

In the display apparatus displaying the high resolution image, a space of the driving chip is utilized to provide the additional output terminals 480, 490 and 500 such that a compact display apparatus is implemented.

Figure 10:
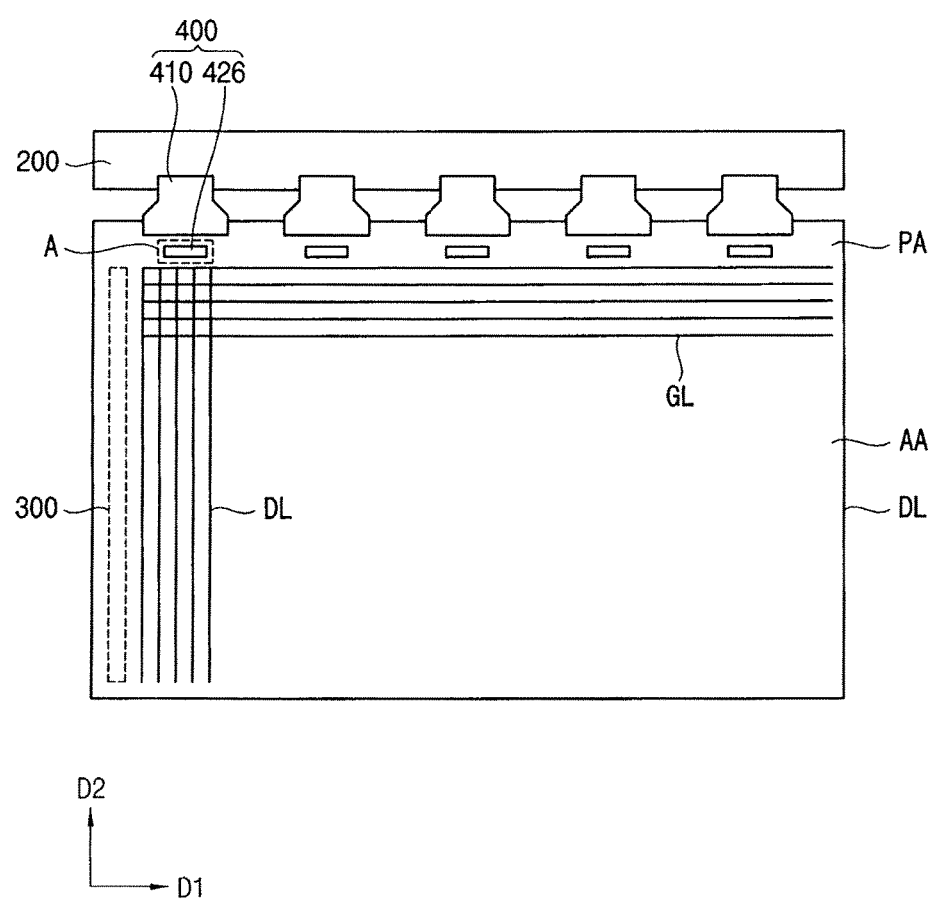
FIG. 10 is a plan view illustrating a display apparatus according to an exemplary embodiment of the present invention.
Figure 11:
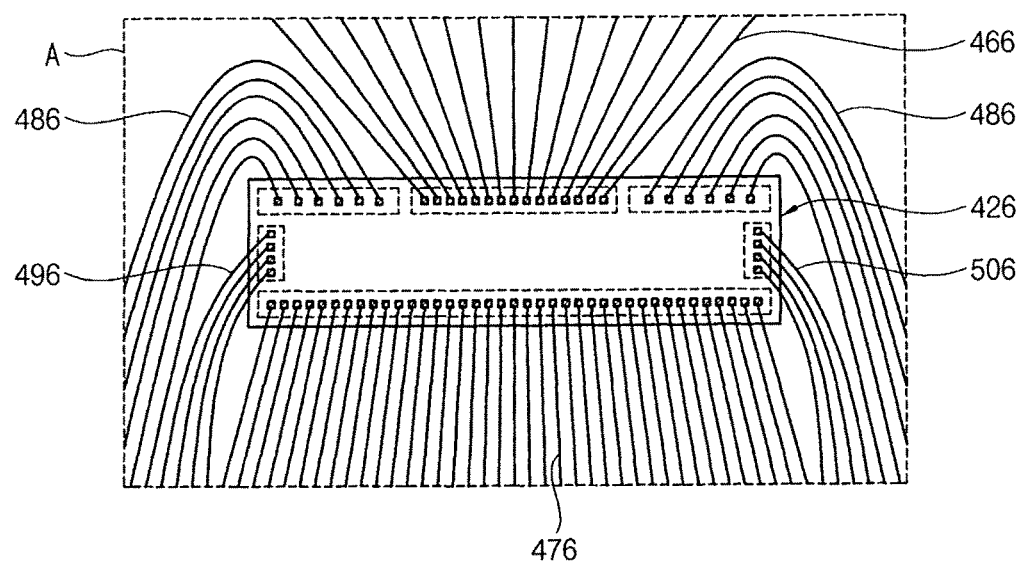
FIG. 11 is an enlarged view of region A of FIG. 10, according to an exemplary embodiment of the present invention.

FIG. 10 is a plan view illustrating a display apparatus according to an exemplary embodiment of the present invention. FIG. 11 is an enlarged view of region A of FIG. 10, according to an exemplary embodiment of the present invention. The display apparatus of FIGS. 10 and 11 may be substantially the same as that of FIGS. 1, 2, 8 and 9, except for the data driving chip, which is mounted on a peripheral region of a display panel. Thus, like reference numerals may refer to like elements, and repetitive explanations thereof may be omitted.

Referring to FIGS. 10, 11 and 8, the display apparatus may include a display panel 100 and a display panel driver.

The display panel 100 includes an active region AA on which an image is displayed and a peripheral region PA adjacent to the active region AA. An image is not displayed on the peripheral region PA. The active region AA may be referred to as a display region.

The display panel 100 may include a first substrate 110 and a second substrate 150 opposite to the first substrate 110.

The display panel driver may apply a driving signal to the display panel 100. The display panel driver may include a gate driver 300 and a data driver 400.

In an exemplary embodiment of the present invention, the display panel driver may further include a controller applying a control signal to the gate driver 300 and the data driver 400. The controller may include a printed circuit board 200.

For example, the printed circuit board 200 may include a driving circuit such as a timing controller, a power voltage generator, etc.

The gate driver 300 may be directly mounted on the peripheral region PA as an ASG. Alternatively, the gate driver 300 may include a plurality of flexible substrates connected to the peripheral region PA of the display panel 100 and a plurality of gate driving chips. Each of the gate driving chips may be mounted on a respective one of the flexible substrates.

The data driver 400 may include and a plurality of data driving chips 426 and a plurality of data flexible substrates 410 electrically connecting the printed circuit board 200 with the display panel 100.

For example, each of the data driving chips 426 may be mounted on the peripheral region PA of the display panel 100 as a COG Each of the data driving chips 426 may include a chip body 430, a plurality of input terminals 460, a plurality of first output terminals 470, a plurality of second output terminals 480, a plurality of third output terminals 490 and a plurality of fourth output terminals 500.

The input terminals 460 may be disposed at a first region 442 of a bottom surface 440, adjacent to a first side surface 432 of the chip body 430. The input terminals 460 may be arranged along the first side surface 432 of the chip body 430. For example, the input terminals 460 may be arranged along the extension direction of the first side surface 432 of the chip body 430.

The first output terminals 470 may be disposed at a second region 444 of the bottom surface 440, adjacent to a second side surface 434 opposite to the first side surface 432 of the chip body 430. The first output terminals 470 may be arranged along the second side surface 434 of the chip body 430. For example, the first output terminals 470 may be arranged along the extension direction of the second side surface 434 of the chip body 430.

The second output terminals 480 may be disposed at a third region 446 of the bottom surface 440, adjacent to the first side surface 432 of the chip body 430. The third region 446 of the bottom surface 440 may be spaced apart from the second region 444 of the bottom surface 440 of the chip body 430. The second output terminals 480 may be arranged along the first side surface 432 of the chip body 430. For example, the second output terminals 480 may be arranged along the extension direction of the first side surface 432 of the chip body 430.

The third output terminals 490 may be disposed at a fourth region 452 of the bottom surface 440, adjacent to a third side surface 436 connecting the first and second side surfaces 432 and 434 of the chip body 430. The third output terminals 490 may be arranged along the third side surface 436 of the chip body 430. For example, the third output terminals 490 may be arranged along the extension direction of the third side surface 436 of the chip body 430.

The fourth output terminals 500 may be disposed at a fifth region 454 of the bottom surface 440 of the chip body 430, adjacent to a fourth side surface 438 connecting the first and second side surfaces 432 and 434 of the chip body 430. The fourth side surface 438 of the chip body 430 may be opposite to the third side surface 436. The fourth output terminals 500 may be arranged along the fourth side surface 438 of the chip body 430. For example, the fourth output terminals 500 may be arranged along the extension direction of the fourth side surface 438 of the chip body 430.

In an exemplary embodiment of the present invention, the third region 446 of the bottom surface 440 of the chip body 430 may include first and second output regions 448 and 450 spaced apart from each other. For example, the first region 442 of the bottom surface 440 of the chip body 430 may be disposed between the first and second output regions 448 and 450. A portion of the second output terminals 480 may be arranged at the first output region 448. Another portion of the second output terminals 480 may be arranged at the second output region 450.

In an exemplary embodiment of the present invention, a plurality of input wires 466 may electrically connect the data flexible substrates 410 with the input terminals 460. A plurality of first output wires 476 may electrically connect the first output terminals 470 of the data driving chip 426 with the data lines DL. A plurality of second output wires 486 may electrically connect the second output terminals 480 of the data driving chip 426 with the data lines DL. A plurality of third output wires 496 may electrically connect the third output terminals 490 of the data driving chip 426 with the data lines DL. A plurality of fourth output wires 506 may electrically connect the fourth output terminals 500 of the data driving chip 426 with the data lines DL.

In a display apparatus, according to an exemplary embodiment of the present invention, additional second, third, and fourth output terminals 480, 490 and 500 may be disposed at the bottom surface 440 of the chip body 430. For example, a high resolution image may be displayed at the display apparatus without increasing a bezel size or a driving chip size of the display apparatus.

In the display apparatus displaying the high resolution image, a space of the driving chip is utilized to provide the additional second, third and fourth output terminals 480, 490 and 500 such that a compact display apparatus is implemented.

In a display apparatus, according to an exemplary embodiment of the present invention, a space of the driving chip is utilized to provide additional output terminals such that a compact display apparatus is provided. For example, additional output terminals may be disposed at a bottom surface of a chip body. A high resolution image may be displayed by the display apparatus without increasing a bezel or a driving chip size.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display apparatus, comprising:
a display panel; and
a display panel driver that includes a controller, a driver, and a plurality of flexible substrates electrically connecting the controller with the display panel,
wherein the controller is configured to generate a control signal,
wherein the driver includes a plurality of driving chips,
wherein each of the driving chips is configured to generate a driving signal based on the control signal, wherein each of the driving chips is configured to apply the driving signal to the display panel, and wherein each of the driving chips is associated with a respective one of the flexible substrates,
wherein each of the driving chips includes:
a chip body including a bottom surface,
a first side surface connected to the bottom surface, second side surface opposite to the first side surface, a third side surface connected to the first and second side surfaces, and a fourth side surface opposite to the third side surface and connected to the first and second side surfaces;
a plurality of input terminals for receiving the control signal, wherein the input terminals are disposed at a first region of the bottom surface adjacent to the first side surface of the chip body, and the input terminals are arranged along a direction in which the first side surface of the chip body extends;
a plurality of first output terminals for outputting the driving signal, wherein the first output terminals are disposed at a second region of the bottom surface adjacent to the second side surface of the chip body, and the first output terminals are arranged along a direction in which the second side surface of the chip body extends;
a plurality of second output terminals for outputting the driving signal, wherein the second output terminals are disposed at a third region of the bottom surface adjacent to the first side surface of the chip body and spaced apart from the second region of the bottom surface, and the second output terminals are arranged along the direction in which the first side surface of the chip body extends,
a plurality of third output terminals for outputting the driving signal, wherein the third output terminals are disposed at a fourth region of the bottom surface adjacent to the third side surface of the chip body, and the third output terminals are arranged along a direction in which the third side surface of the chip body extends; and
a plurality of fourth output terminals for outputting the driving signal, wherein the fourth output terminals are disposed at a fifth region of the bottom surface adjacent to the fourth side surface of the chip body and the fourth output terminals are arranged along a direction in which the fourth side surface of the chin body extends,
wherein each of the flexible substrates includes:
a plurality of first, second, third and fourth output pads that are arranged on each of the flexible substrates along the direction in which the second side surface of the chip body extends to make contact with the display panel;
a plurality of first output wires, wherein the first output wires electrically connect the first output terminals with the first output pads;
a plurality of second output wires, wherein the second output wires electrically connect the second output terminals with the second output pads;
a plurality of third output wires, wherein the third output wires electrically connect the third output terminals with the third output pads; and
a plurality of fourth output wires, wherein the fourth output wires electrically connect the fourth output terminals with the fourth output pads,
wherein all of the first, second, third and fourth output wires are formed without passing through the chip body.

2. The display apparatus of claim 1,
wherein the third region of the bottom surface of the chip body includes first and second output regions spaced apart from each other, and
wherein a first portion of the second output terminals are disposed at the first output region of the bottom surface of chip body, and a second portion of the second output terminals are disposed at the second output region of the bottom surface of chip body.

3. The display apparatus of claim 1, wherein each of the flexible substrates further includes:
a plurality of input pads that are arranged on each of the flexible substrates along the direction in which the first side surface of the chip body extends to make contact with the controller; and
a plurality of input wires, wherein the input wires electrically connect the input pads with the input terminals.

4. The display apparatus of claim 1,
wherein the display panel includes an active region for displaying an image and a peripheral region disposed adjacent to the active region, and
wherein each of the driving chips is mounted on the peripheral region of the display panel.

5. The display apparatus of claim 1, wherein the driving signal includes a data voltage, and
wherein each of the driving chips includes a data driving chip configured to generate the data voltage.

6. The display apparatus of claim 1, wherein the controller includes a printed circuit board.

7. The display apparatus of claim 2, wherein the display panel further includes a liquid crystal layer or an organic light emitting layer interposed between the first and second substrates.

* * * * *